(12) United States Patent
Ueda et al.

(10) Patent No.: US 7,170,371 B2
(45) Date of Patent: Jan. 30, 2007

(54) SURFACE ACOUSTIC WAVE DEVICE WITH A THICKER PARTIAL BUS BAR AREA AND OPTIMAL BUS BAR TO ELECTRODE TIP GAP

(75) Inventors: Masanori Ueda, Yokohama (JP); Osamu Kawachi, Yokohama (JP); Shogo Inoue, Kawasaki (JP); Jun Tsutsumi, Kawasaki (JP); Takashi Matsuda, Kawasaki (JP); Yoshio Satoh, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 10/823,648

(22) Filed: Apr. 14, 2004

(65) Prior Publication Data

US 2004/0251990 A1    Dec. 16, 2004

(30) Foreign Application Priority Data

Apr. 23, 2003    (JP) .............................. 2003-118090

(51) Int. Cl.
  *H03H 9/64*    (2006.01)
  *H03H 9/25*    (2006.01)
(52) U.S. Cl. .................................. 333/195; 310/313 D
(58) Field of Classification Search ...................... None
  See application file for complete search history.

(56) References Cited

U.S. PATENT DOCUMENTS

| | | | |
|---|---|---|---|
| 5,682,126 A * | 10/1997 | Plesski et al. .............. 333/193 |
| 5,710,529 A | 1/1998 | Sugiyama et al. .......... 333/193 |
| 6,121,860 A * | 9/2000 | Tsutsumi et al. ............ 333/195 |
| 6,172,580 B1 * | 1/2001 | Taniguchi et al. .......... 333/193 |
| 6,377,138 B1 * | 4/2002 | Takagi et al. ................ 333/193 |
| 6,404,101 B1 * | 6/2002 | Taniguchi et al. ...... 310/313 A |
| 6,714,102 B2 | 3/2004 | Ruby et al. |
| 6,731,046 B2 * | 5/2004 | Watanabe et al. ....... 310/313 R |
| 6,903,626 B2 * | 6/2005 | Tsutsumi et al. ............ 333/133 |
| 6,989,724 B2 * | 1/2006 | Watanabe et al. ........... 333/133 |
| 2002/0057036 A1 | 5/2002 | Taniguchi et al. ...... 310/313 B |
| 2002/0153970 A1 * | 10/2002 | Noto .......................... 333/195 |
| 2003/0117039 A1 * | 6/2003 | Tsutsumi et al. ...... 310/313 B |
| 2003/0117240 A1 * | 6/2003 | Inoue et al. ................. 333/195 |
| 2003/0155993 A1 * | 8/2003 | Takamine et al. ........... 333/133 |

FOREIGN PATENT DOCUMENTS

| | | | |
|---|---|---|---|
| EP | 1 037 384 A2 | | 9/2000 |
| EP | 1 037 384 A3 | | 9/2000 |
| JP | 11-191720 | * | 7/1999 |
| JP | 2002-100952 | | 4/2002 |
| JP | 2002-176333 | | 6/2002 |
| JP | 2002-314366 | | 10/2002 |
| JP | 2002-314368 | | 10/2002 |

* cited by examiner

*Primary Examiner*—Barbara Summons

(57) ABSTRACT

Efficient transverse energy confinement, and provision of a surface acoustic wave filter having preferable characteristics of both insertion loss and shape factor are obtained. In the surface acoustic wave filter, electrode fingers of one comb electrode are laid in a state of being inserted to the electrode fingers of the other comb electrode, and a thick film thicker than each plurality of electrode fingers is produced in a partial area of the bus bar, and a tip gap is provided between the top of each plurality of electrode fingers and the end face of the opposed bus bar, with a distance therebetween set not greater than $0.2\lambda$ (where, $\lambda$ is one period of the comb electrode).

15 Claims, 7 Drawing Sheets

SURFACE ACOUSTIC WAVE DEVICE WITH A THICKER PARTIAL BUS BAR AREA AND OPTIMAL BUS BAR TO ELECTRODE TIP GAP

FIELD OF THE INVENTION

The present invention relates to a surface acoustic wave device, and more particularly a surface acoustic wave device having filter characteristics of low loss and good rectangularity.

BACKGROUND OF THE INVENTION

A surface acoustic wave filter, that is, a surface acoustic wave device using the characteristics of a surface acoustic wave propagated on a substrate, has features of being more small-sized and lighter in weight, with a filter characteristic of better shape factor, than a dielectric filter or a laminated LC filter. Because of such merits, the surface acoustic wave filter is now widely for use in a cellular phone, etc.

In particular, when the surface acoustic wave filter is employed in a radio frequency (RF) section of the cellular phone or the like, the surface acoustic wave filter is required to have characteristics of low loss and good shape factor, in order to obtain improved receiving sensitivity, reduced consumption power, and sufficient noise-level suppression in the vicinity of the passband.

To meet such requirements, a variety of techniques have been proposed against the surface acoustic wave device to enhance the characteristic when used as surface acoustic wave filter. One of these techniques has been applied to an interdigital transducer (IDT) having a pair of comb electrodes and electrode fingers mutually interpolated between the comb electrodes, which are formed on a piezoelectric substrate of rotated Y-cut, X-propagating $LiTaO_3$. In such an IDT, by narrowing a gap length between the tips of the plurality of electrode fingers constituting the comb electrodes and the bus bars connecting the plurality of electrode fingers is narrowed, it becomes possible to suppress a surface skimming bulk wave (SSBW) produced in the above-mentioned gap area. Using this method, a filter having good flatness in the passing characteristic is obtainable. (See the official gazette of the Japanese Unexamined Patent Publication No. 2002-31436Patent:patent document 1)

In another technique, a piezoelectric substrate having an anisotropic factor ($\gamma$) lower than $-1$ in the propagation direction is used. By determining a ratio L/S, a ratio of an electrode width L of the electrode fingers in the comb electrode constituting an IDT to a space S between neighboring electrode fingers, as well as a film thickness of the bus bar, the surface acoustic wave energy is efficiently confined. Thus an improved filter characteristic with a reduced loss can be obtained. (See the official gazette of the Japanese Unexamined Patent Publication No. 2002-100952: patent document 2)

Further, there is a technique that has been proposed by the inventors of the present invention, to obtain both wide bandwidth and low loss, by specifying a ratio between the electrode film thickness and the surface acoustic wave wavelength, and also a ratio between the electrode width and the electrode pitch as having particular relations (See the official gazette of the Japanese Unexamined Patent Publication No. 2002-176333:patent document 3).

Also, in the prior Japanese patent application No. 2001-390707 filed by the present applicant, a technique for obtaining a filter of good shape factor has been proposed. By specifying a particular relation in a ratio of the electrode width against the electrode pitch in a surface acoustic wave filter constituting a ladder filter, a filter of good shape factor is achieved.

Here, by sufficiently confining the wave energy in the transverse direction (i.e. perpendicular to the propagation direction) of the surface acoustic wave produced in an IDT, it becomes possible to obtain a filter having improved performance of loss and shape factor. The following aspects may be considered as a technique for such confinement of the wave energy in the transverse direction.

In one aspect, difference between the acoustic wave velocities in the bus bar and in the comb electrode is utilized, and the electrode thickness of the bus bar is increased, so as to obtain a reduced acoustic wave velocity, in case of using a leaky surface acoustic wave (LSAW) traveling on the substrate of rotated Y-cut, X-propagating $LiTaO_3$ (refer to Patent document 2). Or, in another aspect, a dummy electrode is provided (Patent document 1).

When the energy propagating in the transverse direction is confined using the above-mentioned technique, in one sense, an improved filter loss is obtained. However, according to the survey and study carried out by the inventors of the present invention, the acoustic wave energy is concentrated at the tip gap of the bus bar and the comb electrode. Through our survey, it has been turned out that this concentrated energy results in an insertion loss generated in the filter.

Also, as another aspect, a technique has been disclosed in the aforementioned patent application: Japanese Patent Application No. 2001-390707. According to the technique, in a series arm resonator constituted of a ladder filter, a ratio L/S, i.e. ratio of an electrode width of a comb electrode to a distance between the electrodes, is set to approximately 0.35, to increase the acoustic wave velocity of the comb electrode. In addition, a dummy electrode is provided to confine the energy, thereby improving the passband characteristic particularly on the high frequency side. However, even in such a technique, the surface acoustic wave energy is concentrated at the tip gap. A similar problem occurs in a multimode filter, even when increasing the ratio L/S of the electrode width to the distance between the electrodes of the comb electrode, and at the same time, employing a dummy electrode.

SUMMARY OF THE INVENTION

Accordingly, it is an object of the present invention to solve the problems lying in the techniques disclosed in the patent documents 1 and 2, and the techniques having been proposed by the inventors of the present invention, and provide a surface acoustic wave device having lower insertion loss and better shape factor.

As a first aspect of the present invention to solve the above-mentioned problems, a surface acoustic wave device includes: a pair of reflective electrodes formed on a single-crystal piezoelectric substrate; and at least one set of comb electrodes formed between the pair of reflective electrodes. Each comb electrode constituting the comb electrode set includes a plurality of electrode fingers, and a bus bar connecting the plurality of electrode fingers in common. The electrode fingers of one comb electrode are laid in a state of being inserted to the electrode fingers of the other comb electrode. Thick film thicker than each plurality of electrode fingers is produced in partial areas of the bus bar. And, a tip gap is provided between the top of each plurality of electrode fingers and the end face of the opposed bus bar, with a distance therebetween set not greater than 0.2λ (where, λ is one period of the comb electrode).

As a second aspect of the present invention to solve the above-mentioned problems, a surface acoustic wave device includes: a pair of reflective electrodes formed on a single-crystal piezoelectric substrate; and at least one set of comb electrodes formed between the pair of reflective electrodes. Each comb electrode constituting the comb electrode set includes: a plurality of electrode fingers and a plurality of dummy electrodes disposed alternately; and a bus bar connecting the plurality of electrode fingers and the plurality of dummy electrodes in common. The electrode fingers of one comb electrode are laid in a state of being inserted to the electrode fingers of the other comb electrode, and a tip gap is provided between the top of each plurality of electrode fingers and the top of the opposed dummy electrode, with a distance therebetween set not greater than 0.2λ (where, λ is one period of the comb electrode).

As a third aspect of the present invention, a surface acoustic wave device includes: a pair of reflective electrodes formed on a single-crystal piezoelectric substrate; and three sets of comb electrodes formed between the pair of reflective electrodes. Each comb electrode constituting the comb electrode set includes: a plurality of electrode fingers and a plurality of dummy electrodes disposed alternately; and a bus bar connecting the plurality of electrode fingers and the plurality of dummy electrodes in common. The electrode fingers of one comb electrode are laid in a state of being inserted to the electrode fingers of the other comb electrode, and a tip gap is provided between the top of each plurality of electrode fingers and the top of the opposed dummy electrode, with a distance therebetween set not greater than 0.2λ (where, λ is one period of the comb electrode).

As a fourth aspect of the present invention, a surface acoustic wave device includes a plurality of resonators connected into a ladder shape. Each resonator includes: a pair of reflective electrodes formed on a single-crystal piezoelectric substrate; and at least one set of comb electrodes formed between the pair of reflective electrodes. Each comb electrode of the comb electrode set constituting the resonator includes: a plurality of electrode fingers and a plurality of dummy electrodes disposed alternately; and a bus bar connecting the plurality of electrode fingers and the plurality of dummy electrodes in common. The electrode fingers of one comb electrode are laid in a state of being inserted to the electrode fingers of the other comb electrode, and a tip gap is provided between the top of each plurality of electrode fingers and the top of the opposed dummy electrode, with a distance therebetween set not greater than 0.2λ (where, λ is one period of the comb electrode).

As a fifth aspect of the present invention, a surface acoustic wave device includes a plurality of resonators connected into a lattice shape. Each resonator includes: a pair of reflective electrodes formed on a single-crystal piezoelectric substrate; and at least one set of comb electrodes formed between the pair of reflective electrodes. Each comb electrode of the comb electrode set constituting the resonator includes: a plurality of electrode fingers and a plurality of dummy electrodes disposed alternately; and a bus bar connecting the plurality of electrode fingers and the plurality of dummy electrodes in common. The electrode fingers of one comb electrode are laid in a state of being inserted to the electrode fingers of the other comb electrode, and a tip gap is provided between the top of each plurality of electrode fingers and the top of the opposed dummy electrode, with a distance therebetween set not greater than 0.2λ (where, λ is one period of the comb electrode).

As a sixth aspect of the present invention, a surface acoustic wave device includes: a pair of reflective electrodes formed on a single-crystal piezoelectric substrate; and three sets of comb electrodes formed between the pair of reflective electrodes. Each comb electrode forming the comb electrode set includes a plurality of electrode fingers, and a bus bar connecting the plurality of electrode fingers in common. The electrode fingers of one comb electrode are laid in a state of being inserted to the electrode fingers of the other comb electrode. Thick film thicker than each plurality of electrode fingers is produced in partial areas of the bus bar. And, a tip gap is provided between the top of each plurality of electrode fingers and the end face of the opposed bus bar, with a distance therebetween set not greater than 0.2λ (where, λ is one period of the comb electrode).

As a seventh aspect of the present invention, a surface acoustic wave device includes a plurality of resonators connected into a ladder shape. Each resonator includes: a pair of reflective electrodes formed on a single-crystal piezoelectric substrate; and at least one set of comb electrodes formed between the pair of reflective electrodes. Each comb electrode of the comb electrode set constituting the resonator includes a plurality of electrode fingers, and a bus bar connecting the plurality of electrode fingers in common. The electrode fingers of one comb electrode are laid in a state of being inserted to the electrode fingers of the other comb electrode. Thick film thicker than each plurality of electrode fingers is produced in partial areas of the bus bar. And, a tip gap is provided between the top of each plurality of electrode fingers and the end face of the opposed bus bar, with a distance therebetween set not greater than 0.2λ (where, λ is one period of the comb electrode).

As an eighth aspect of the present invention, a surface acoustic wave device includes a plurality of resonators connected into a lattice shape. Each resonator includes: a pair of reflective electrodes formed on a single-crystal piezoelectric substrate; and at least one set of comb electrodes formed between the pair of reflective electrodes. Each comb electrode of the comb electrode set constituting the resonator includes a plurality of electrode fingers, and a bus bar connecting the plurality of electrode fingers in common. The electrode fingers of one comb electrode are laid in a state of being inserted to the electrode fingers of the other comb electrode. Thick film thicker than each plurality of electrode fingers is produced in partial areas of the bus bar. And, a tip gap is provided between the top of each plurality of electrode fingers and the end face of the opposed bus bar, with a distance therebetween set not greater than 0.2λ (where, λ is one period of the comb electrode).

As a ninth aspect of the present invention, in one of the second to the fifth aspects of the surface acoustic wave device described above, thick film thicker than each plurality of electrode fingers is further produced in partial areas of the bus bar.

As a tenth aspect of the present invention, in the third or the sixth aspect, a ratio L/S of an electrode width L of the electrode finger to a space S between neighboring electrode fingers is set to between 0.6 and 0.8.

As an eleventh aspect of the present invention, in either one of the first aspect and the sixth to the ninth aspects, each partial area of the bus bar in which the thick film is produced is disposed with a distance of not greater than 0.75λ from the connection end face of the bus bar to each plurality of electrode fingers (where, λ is one period of the comb electrode).

As a twelfth aspect of the present invention, in either one of the first aspect and the sixth to the ninth aspects, the plurality of electrode fingers and the bus bar connecting the electrode fingers is formed of metal of which 5 principal component is aluminum. And, each partial area of the bus bar in which the thick film is produced has an additional thickness of not less than 0.05λ where, λ is one period of the comb electrode.

As a thirteenth aspect of the present invention, in the twelfth aspect, preferably, each partial area of the bus bar in which the thick film is produced has an additional thickness of not greater than 0.35λ where, λ is one period of the comb electrode.

As a fourteenth aspect of the present invention, in either one of the first aspect and the sixth to the ninth aspects, each partial area of the bus bar in which the thick film is produced is formed of heavy metal.

As a fifteenth aspect of the present invention, in either one of the first aspect and the sixth to the ninth aspects, each partial area of the bus bar in which the thick film is produced is formed of insulating material.

As a sixteenth aspect of the present invention, in either one of the first to the fifteenth aspects, the single-crystal piezoelectric substrate is formed of $LiTaO_3$ or $LiNbO_3$, and a leaky surface acoustic wave of the substrate is used.

Further scopes and features of the present invention will become more apparent by the following description of the embodiments with the accompanying drawings.

DETAILED DESCRIPTION OF THE PREFERRED EMBODIMENTS

The preferred embodiment of the present invention is described hereinafter referring to the charts and drawings.

Prior to the description of the embodiment, for the sake of better understanding of the present invention, energy confinement in the transverse direction will be described first, based on the survey and study by the inventors of the present invention.

Figure 1:
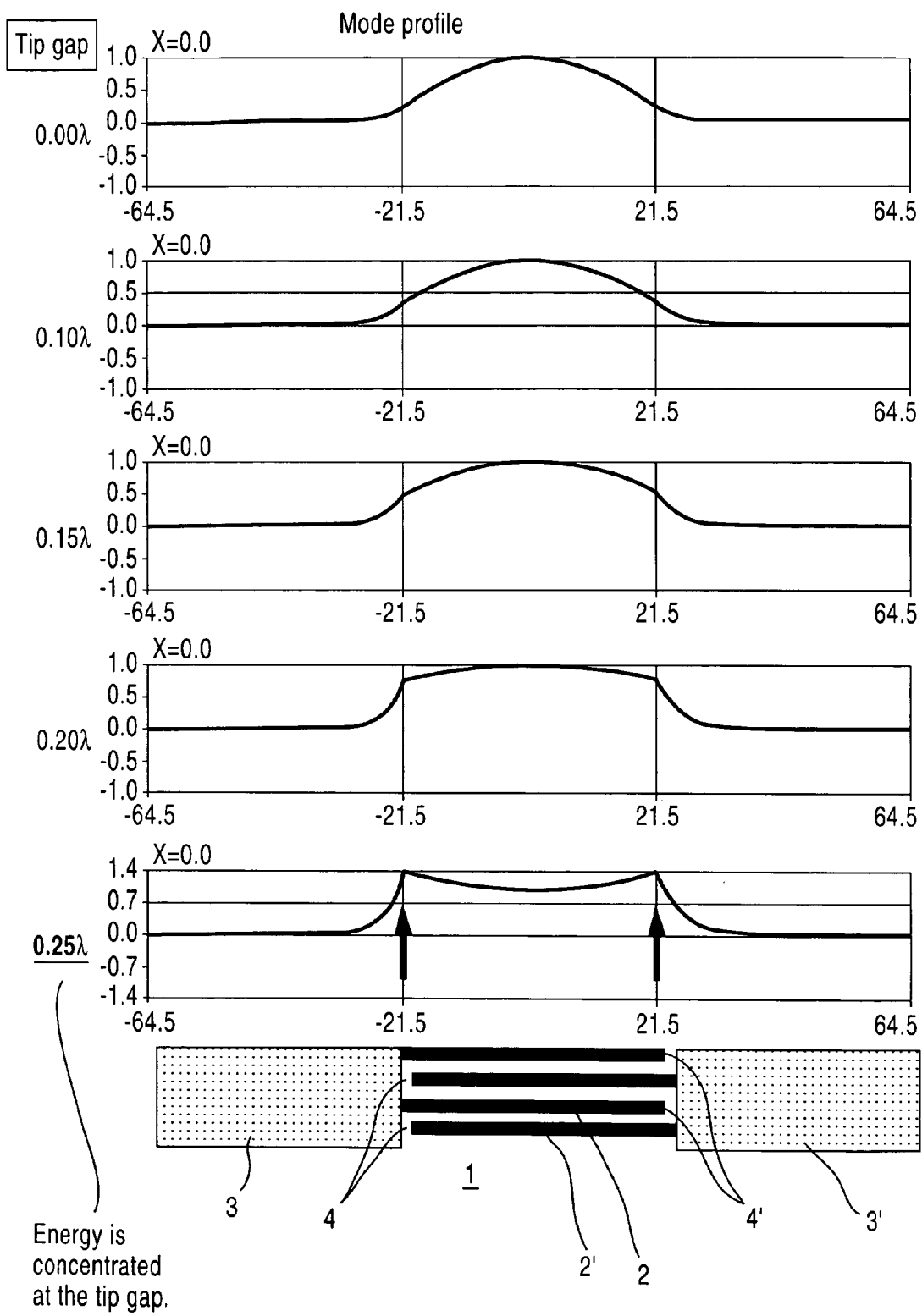
FIG. 1 shows a diagram illustrating an example of a transverse mode profile of a surface acoustic wave when using a leaky surface acoustic wave on a substrate formed of rotated Y-cut, X-propagating $LiTaO_3$.

FIG. 1 shows a diagram illustrating an example of a transverse mode profile of a surface acoustic wave when using a leaky surface acoustic wave on a substrate formed of rotated Y-cut, X-propagating $LiTaO_3$.

In a pair of comb electrodes constituting an IDT 1 shown in this FIG. 1, bus bars 3, 3' respectively connecting a plurality of electrode fingers 2, 2' have thicker electrodes than electrode fingers 2, 2', producing a decreased acoustic wave velocity. The gaps 4, 4' located between the tips of electrode fingers 2, 2' and bus bars 3, 3' are referred to as tip gaps. The value of the tip gap length is normalized by a period (λ) of the comb electrode.

Further, in FIG. 1, a characteristic of the surface acoustic wave in a transverse direction level is shown as a mode profile in the structure of IDT 1 in case the lengths of gaps 4, 4' are varied.

The inventors of the present invention has studied the mode profile in case the gaps 4, 4' are varied in length. For example, 0.00λ denotes the lengths of gaps 4, 4' as parameters are zeroes. Generally, in the conventional filter structure, each length of the gaps 4, 4' is set to 0.25λ.

In this case of FIG. 1, when each gap 4, 4' is set to 0.25λ in length, energy concentration (shown by the bold arrow lines in the figure) is produced apparently in each gap 4, 4'. Further, it is to be understood that the nearer each top of electrode fingers 2, 2' is disposed to each bus bar 3, 3' (0.20λ→0.00λ), the smaller the energy concentration becomes.

Accordingly, the inventors of the present invention have studied on the various embodiment examples based on the above-mentioned understanding.

Here, the substrate for use in the mode profile analysis shown in FIG. 1 is a substrate of 42-degree rotated Y-cut, X-propagating $LiTaO_3$. Electrode fingers 2, 2' of the comb electrodes constituting IDT 1 are formed of aluminum (Al). The film thickness of the electrode is 180 nm, the period λ of each electrode finger 2, 2' is approximately 2 μm (1.9 GHz band), and the aperture length of electrode fingers 2, 2' is 43 μm. Further, electrode fingers 2, 2' are respectively connected to bus bars 3, 3' disposed on the both sides.

On each bus bar 3, 3' of the comb electrode, an Al layer of 300 nm in thickness is accumulated on an Al film having the same thickness as electrode fingers 2, 2', thereby forming an additional thickness. Conventionally, in IDT 1, tip gaps 4, 4' between bus bars 3, 3' and the tips of electrode fingers 2, 2' are generally designed to have a length of 0.25λ against the wavelength. It can be understood from FIG. 1 that the surface acoustic wave energy is concentrated at each gap 4, 4'.

In contrast, by making gaps 4, 4' narrower, energy concentration at gaps 4, 4' is mitigated, and it can be understood an aspect of the energy concentration to the central area of electrode fingers 2, 2'.

Figure 2:
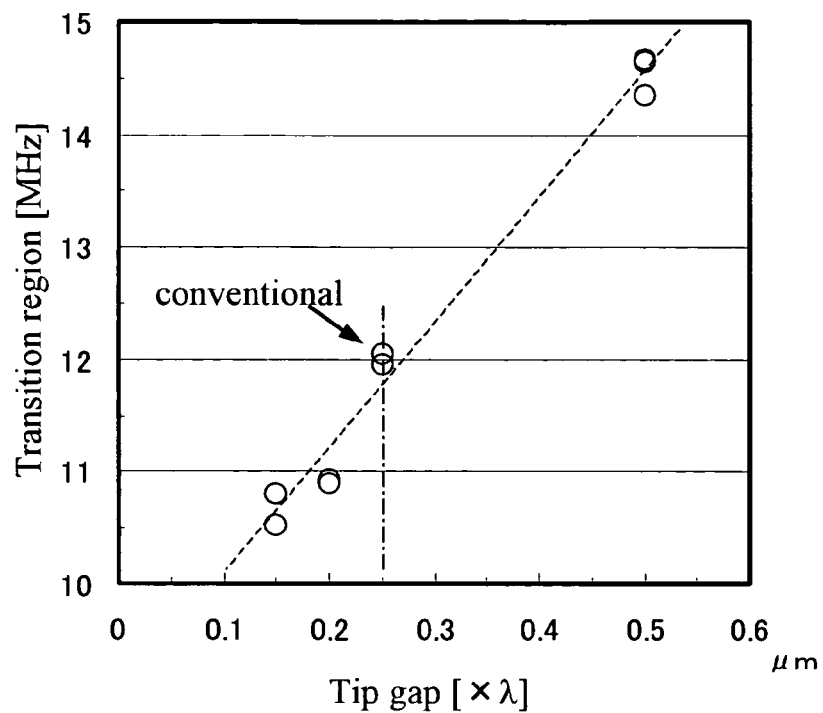
FIG. 2 shows a diagram illustrating a study result on the relation between a tip gap and a filter characteristic.
Figure 3:
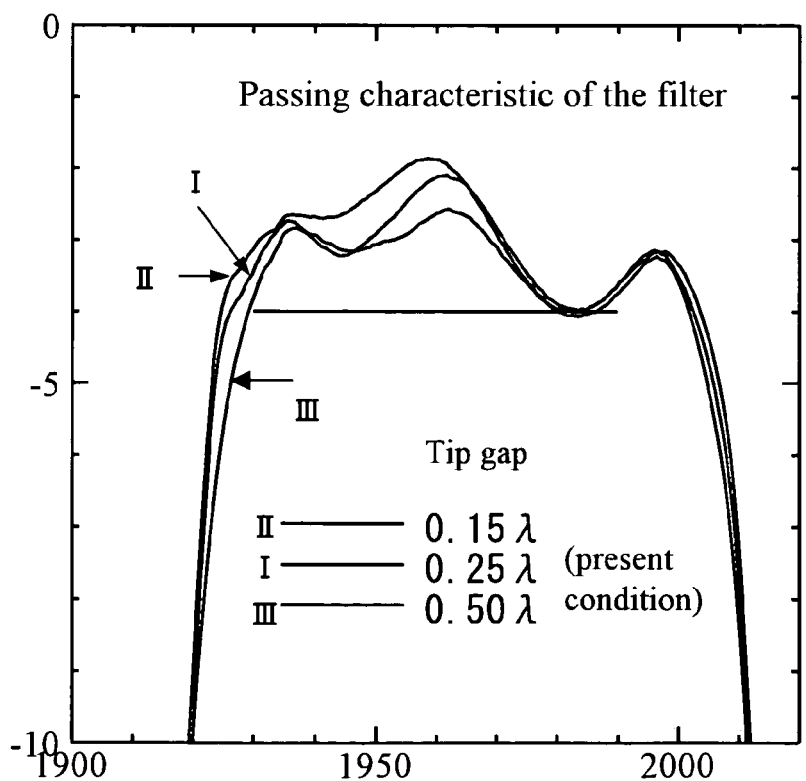
FIG. 3 shows a diagram illustrating a passing characteristic of a three-IDT multimode filter, when tip gaps 4, 4' are varied.
Figure 4:
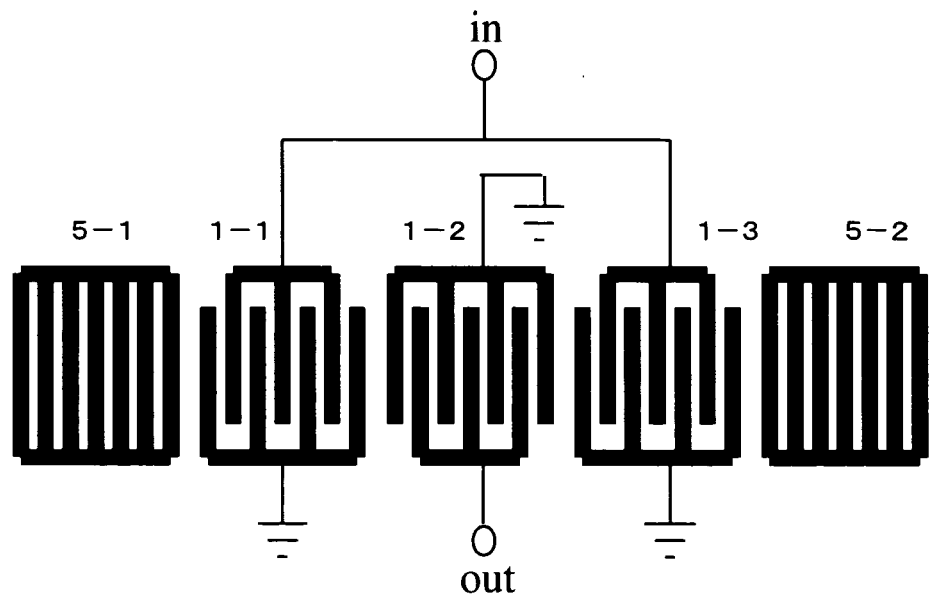
FIG. 4 shows a diagram illustrating an exemplary configuration of a three-IDT multimode filter.

Here, FIG. 2 and FIG. 3 show the study results obtained by the inventors of the present invention in regard to a relation between the tip gap and the filter characteristic. To obtain these results, a three-IDT multimode filter is formed by use of three IDTs 1-1 to 1-3 of 1.9 GHz band, each having the same film thickness on the same single-crystal piezoelectric substrate as IDT 1 shown in FIG. 1. FIG. 4 shows an exemplary configuration of the three-IDT multimode filter.

As shown in the figure, reflective electrodes 5-1, 5-2 are provided adjacent to IDT 1-1 and IDT 1-3, so as to increase the energy concentration. Thus, a surface acoustic wave resonator having a filter characteristic using a resonance characteristic is structured.

Here, in FIGS. 2, 3, by defining a transition region as a frequency difference between a point on the low frequency side of the passband (−4 dB point) and a so-called skirt portion of the filter of −50 DB, variations of the transition region against the sizes of the tip gap are compared.

This transition region signifies that the filter becomes close to an ideal rectangular characteristic when the transition region approaches '0 MHz'. Referring to FIG. 2, the transition region is approximately 12 MHz in case of tip gaps 4, 4' having a value 0.25λ which is generally applied to the conventional filter. In contrast, as shown in FIG. 1, the narrower the tip gap is set, the more the mode profile is concentrated to the central part of the electrode finger, and the transition region is improved.

As can be understood from FIG. 2, in order to obtain a good filter characteristic (having a transition region not greater than 11 MHz for the center frequency of approximately 1.9 GHz), desirably the tip gap size is to be set no greater than 0.2λ. Also, to maintain the filter function without producing a short circuit between electrode fingers 2, 2' and bus bars 3, 3' of the IDT, the tip gap size of at least 0.1 μm is necessary from the viewpoint of a limit in manufacturing. This figure is dependent on the etching technique in the semiconductor process.

FIG. 3 shows a diagram illustrating a passing characteristic of a three-IDT multimode filter when tip gaps 4, 4' are varied. There is shown the passing characteristic against the cases of the tip gaps 4, 4' varied to 0.15λ (II) and 0.50λ (III), which are referenced from 0.25λ (I). It is to be understood, from the characteristic shown in FIG. 3, that the smaller the tip gaps 4, 4' are set, the more the insertion loss is improved particularly on the low frequency side, in a corresponding manner to the variation of the transition region shown in FIG. 2.

Figure 5:
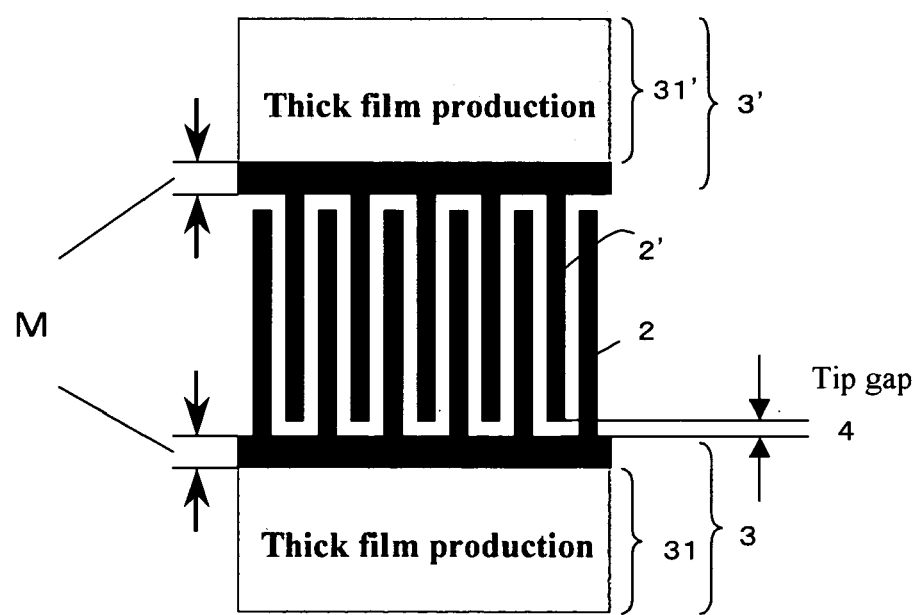
FIG. 5 shows a diagram enlarging only one IDT of the three-IDT multimode filter structure shown in FIG. 4.

Next, a thick film electrode accumulated on bus bars 3, 3' will be examined hereafter. FIG. 5 shows an enlarged diagram of only one IDT in the three-IDT multimode filter structure shown in FIG. 4. Electrode fingers 2, 2' are provided with bus bars 3, 3' disposed on both sides of electrode fingers 2, 2'. Further, according to the embodiment the part of which is shown in FIG. 5, there are formed thick film electrodes on bus bars 3, 3', each accumulated on an area 31 (31') and positioned with a distance M away from the connection face of electrode finger 2 (2') to bus bar 3 (3'). In the following description of the present invention, this distance M is defined as thick film margin.

Figure 6:
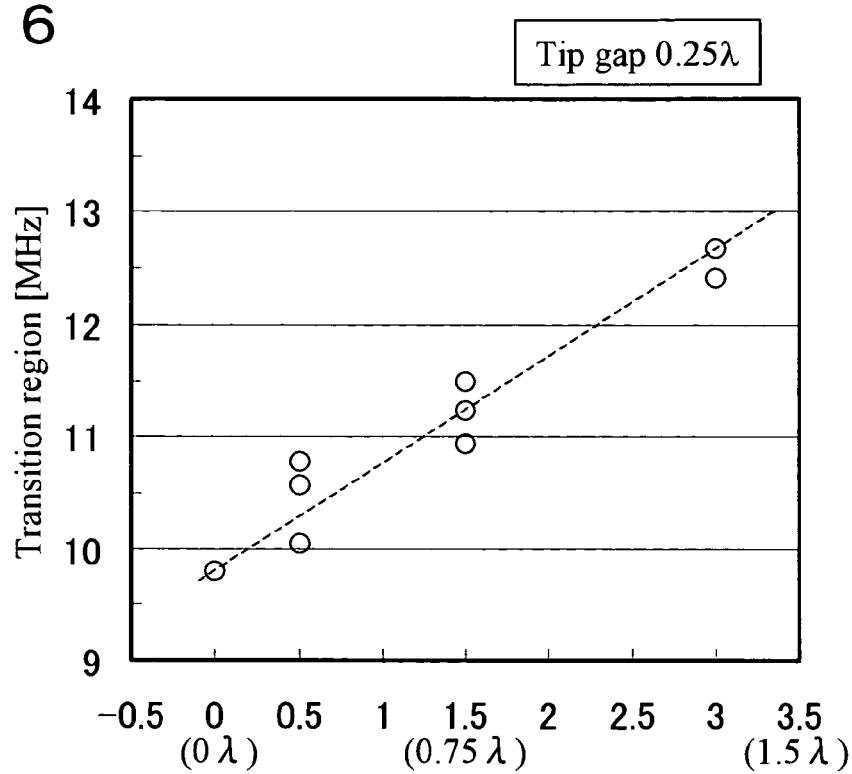
FIG. 6 shows a diagram illustrating a measured result of a relation between a thick film margin M and a transition region.

FIG. 6 shows a diagram illustrating a measured result of a relation between a thick film margin M and a transition region. The filter used in this measurement has the structure of the three-IDT multimode filter same as that explained earlier. It is understood from FIG. 6 that the more the thick film margin M approaches '0', the more the transition region is improved. As having been illustrated in FIG. 2, a good filter characteristic is acquired when the transition region is not greater than 11 MHz for the center frequency of approximately 1.9 MHz. From FIG. 6, the thick film margin M satisfying this condition is no greater than 0.75λ. As for the lower limit, if the M is not greater than 0λ, electrode fingers 2, 2' may undesirably be short-circuited with bus bars 3, 3'. Therefore, there is a certain limit derived from the limit in manufacturing.

Further, the inventors of the present invention have examined the thickness of thick film additionally accumulated on the thick film areas of bus bars 3, 3'.

Figure 7:
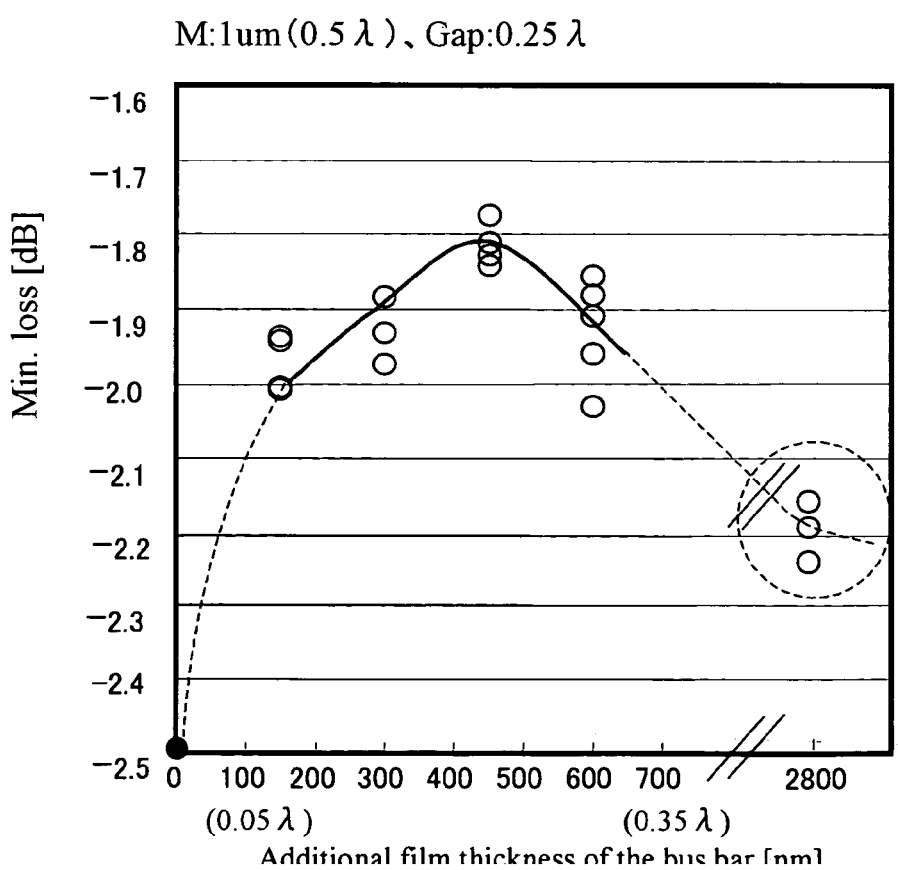
FIG. 7 shows a diagram illustrating a relation between an additional film thickness accumulated on bus bars 3, 3' and a minimum insertion loss of a filter.

FIG. 7 shows a diagram illustrating a relation between an additional film thickness accumulated on bus bars 3, 3' and a minimum filter insertion loss. Here, the additional film thickness denotes a film thickness added to the electrode thickness by further accumulating film on the areas of the thick film margin M of electrode fingers 2, 2' and bus bars 3, 3' in IDT 1.

Also, the filter used here has the same structure as the three-IDT multimode filter described earlier. The chart shown in FIG. 6 depicts measured values, which are obtained under the condition that the thick film margin M is 0.5λ, and each size of gaps 4, 4' between electrode fingers 2, 2' and bus bars 3, 3' is 0.25λ.

From these measured results, when considering the minimum insertion loss, desirably the additional film thickness is to be set no smaller than 0.05λ. Further, if the additional film thickness is set no smaller than 0.05λ and no greater than 0.35λ, a preferable filter characteristic having the minimum insertion loss of no greater than −2 dB may be obtained.

Here, in the above description, aluminum (Al) is used for the thick film to be accumulated on bus bars 3, 3'. However, it may also be possible to use a metallic material of which principal component is Al, or heavy metal such as gold (Au). In such a case, it is desirable to apply the material by comparing the specific gravity with Al. Furthermore, thick films 31, 31' accumulated on bus bars 3, 3' may be an insulating material such as $SiO_2$, because the purpose is to reduce the acoustic wave velocity. By using such an insulating material, it becomes possible to avoid short circuit between electrode fingers 2, 2' and bus bars 3, 3' in IDT 1.

Figure 8:
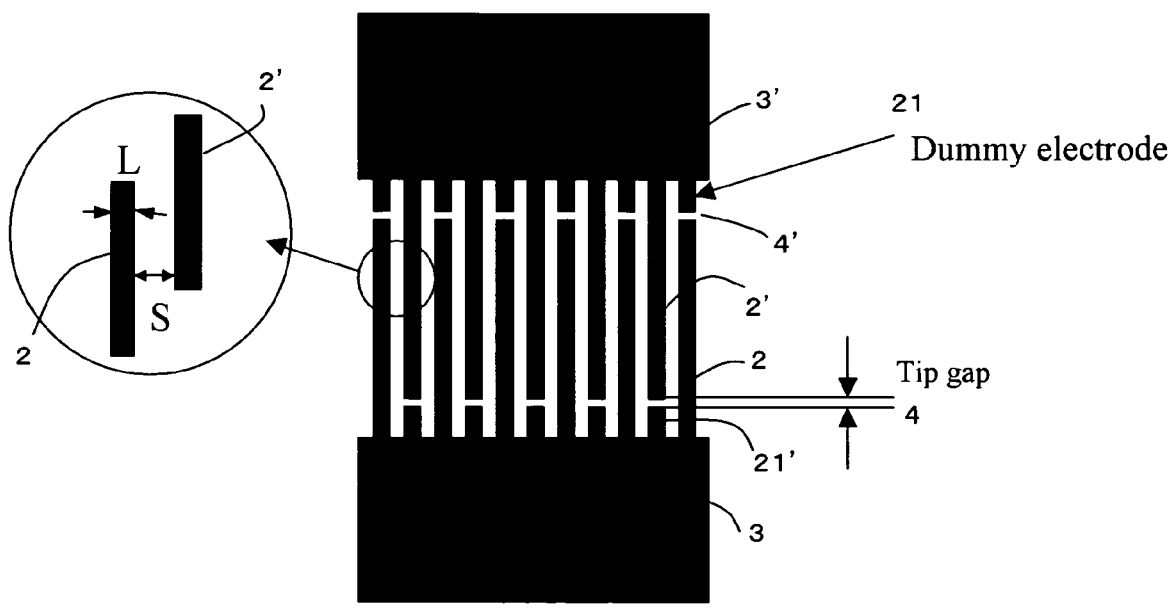
FIG. 8 shows a diagram illustrating an exemplary embodiment of a filter structure, in case dummy electrodes are provided in an IDT.

Now, another embodiment according to the present invention will be described hereafter. As a filter structure in this embodiment, dummy electrodes are provided in the IDT. FIG. 8 shows an exemplary embodiment of a filter structure in case dummy electrodes are provided in the IDT. Dummy electrodes 21, 21' are attached on the tip gaps 4, 4' side between electrode fingers 2, 2' and bus bars 3, 3' of the IDT.

Figure 9:
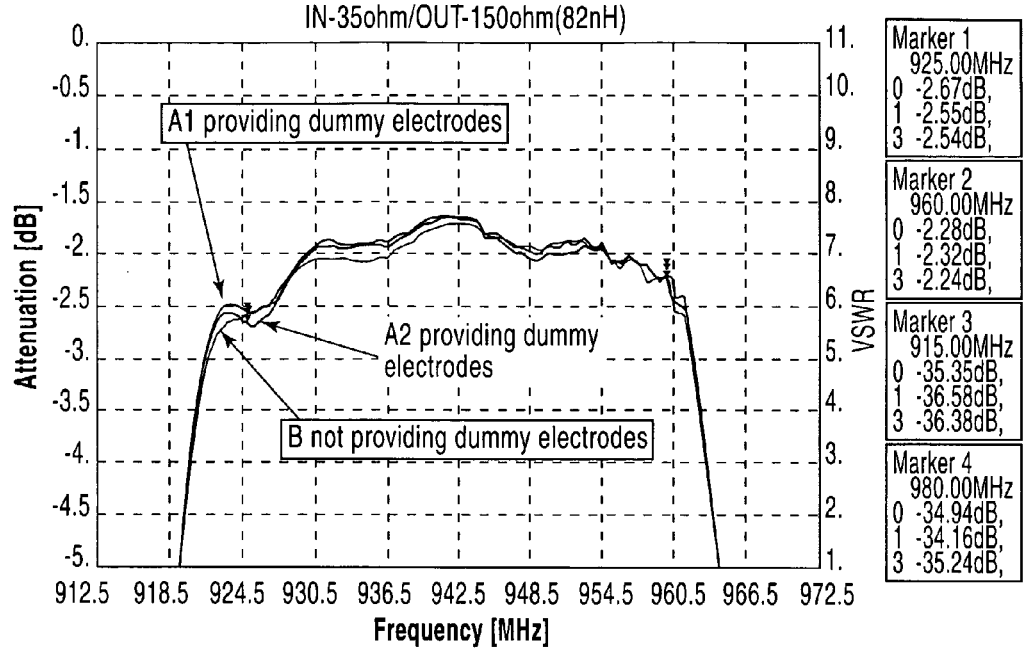
FIG. 9 shows a diagram illustrating a characteristic difference between the cases of existence and non-existence of dummy electrodes.
Figure 10:
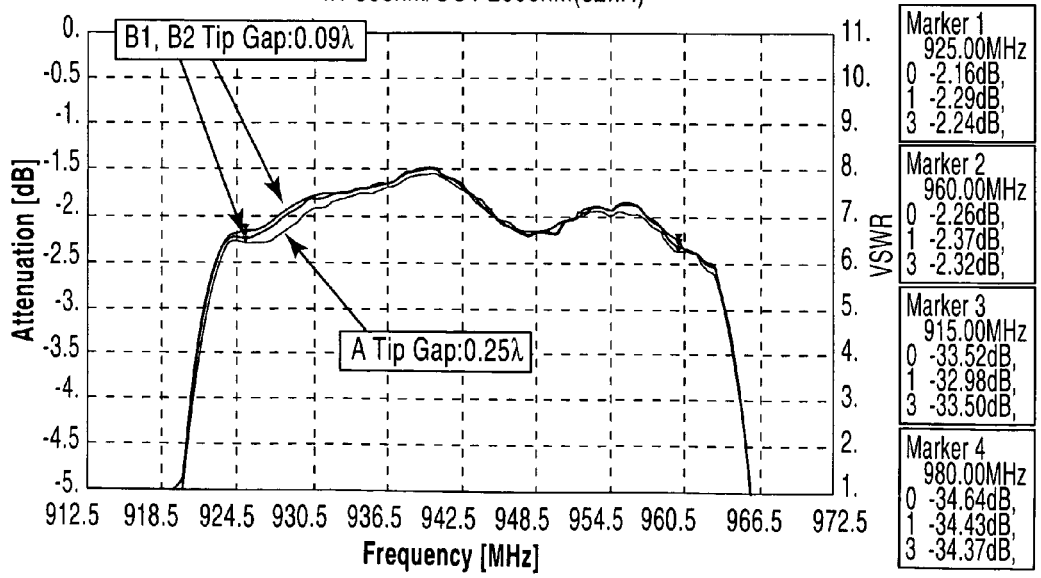
FIG. 10 shows a diagram illustrating a characteristic when tip gaps 4, 4' are varied.

In FIG. 8, an enlarged diagram of the portion enclosed by a circle is shown on the top left, in which an electrode width L of each electrode finger 2, 2' and a neighboring distance S between electrode fingers 2, 2' are shown. FIG. 9 and FIG. 10 illustrate characteristic diagrams of a three-IDT multimode filter for 900 MHz band. In this multimode filter, 42-degree Y-cut $LiTaO_3$ is employed as substrate material, and the ratio L/S of the electrode width L to the space S between the neighboring electrode fingers is set to approximately 0.7.

FIG. 9 illustrates characteristic difference between cases of providing and not providing dummy electrodes. It is understood from the figure that there is an improved loss on the low frequency side of the passband in the two samples having dummy electrodes 21, 21' of 1λ–3λ (A1 and A2, in FIG. 9), as compared to the sample having no dummy electrodes 21, 21' (B in FIG. 9).

Further, a characteristic in case of varied tip gaps 4, 4' is shown in FIG. 10. It is understood that the loss is further improved on the low frequency side of the passband in the two samples (B1, B2 in FIG. 10: 0.09λ), in case the tip gaps is set narrower than in the ordinary case (A in FIG. 10) having gaps of 0.25λ. Here, the L/S of the multimode filter is set to approximately 0.7. A wideband low-loss filter characteristic is obtainable when the L/S is set nearly in the range of 0.6–0.8, which has been confirmed by the inventors of the present invention.

Figure 11:
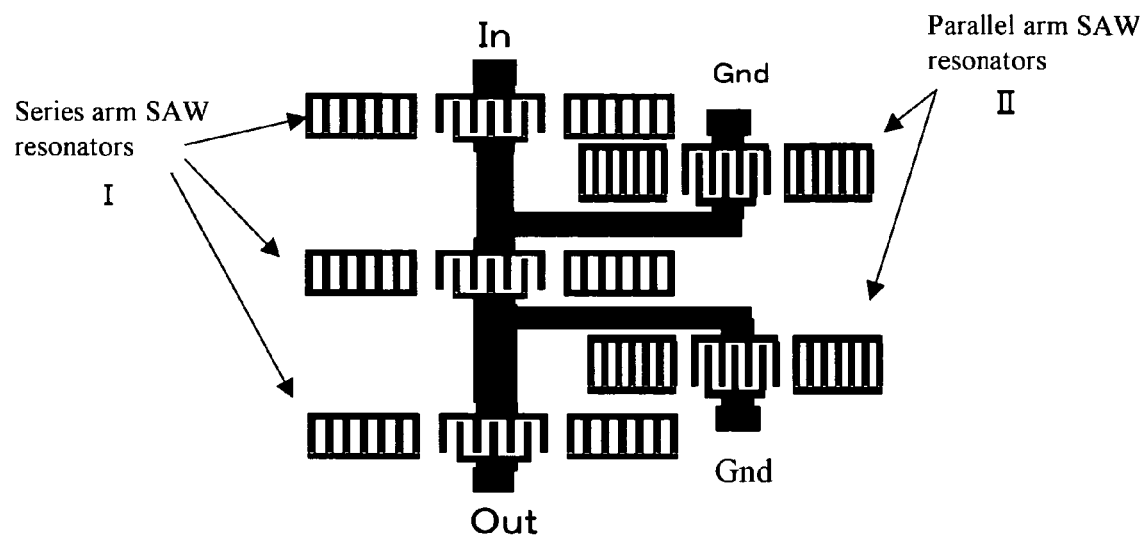
FIG. 11 shows a diagram illustrating a ladder filter having surface acoustic wave resonators connected into a ladder shape.

Also, in case of a ladder filter structured of SAW resonators connected in such a ladder shape as shown in FIG. 11, improvement on both insertion loss and shape factor can be obtained by providing dummy electrodes in each resonator constituting the filter, and narrowing the tip gaps between the electrode fingers. This has also been confirmed by the inventors of the present invention.

In the explanation described above, an exemplary surface acoustic wave filter employing 42-degree, Y-cut $LiTaO_3$ as a single-crystal piezoelectric substrate has been shown. However, other $LiTaO_3$ of different rotation angle (rotated Y), or rotated Y-cut $LiNbO_3$ substrate, may also be applicable.

Figure 12:
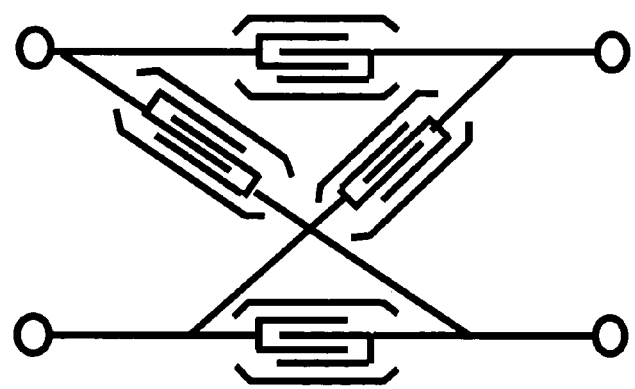
FIG. 12 shows a diagram illustrating a lattice filter constituted of resonators formed into a lattice shape.

It is effective to apply the present invention to the ladder filter shown in FIG. 11, which utilizes a resonance characteristic of a surface acoustic wave, or a multimode filter shown in FIG. 4. It is also effective to apply the present invention to a lattice filter, having the resonators formed into a lattice shape, as shown in FIG. 12.

As the embodiments of the present invention have been described according to the accompanying drawings, the present invention enables efficient transverse energy confinement, and provision of a surface acoustic wave filter having preferable characteristics of both insertion loss and shape factor.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A surface acoustic wave device comprising:
a pair of reflective electrodes formed on a single-crystal piezoelectric substrate; and
at least one set of comb electrodes formed between the pair of reflective electrodes, each comb electrode constituting the comb electrode set including:
a plurality of electrode fingers; and
a bus bar connecting the plurality of electrode fingers in common, wherein, the electrode fingers of one comb electrode are laid in a state of being inserted to the electrode fingers of the other comb electrode, and a thick film thicker than each of the plurality of electrode fingers is produced in a partial area of the bus bar, and a tip gap is provided between the top of each plurality of electrode fingers and the end face of the opposed bus bar, with a distance therebetween set not greater than $0.2\lambda$, where $\lambda$ is one period of the comb electrode.

2. A surface acoustic wave device comprising:
a pair of reflective electrodes formed on a single-crystal piezoelectric substrate; and
at least one set of comb electrodes formed between the pair of reflective electrodes, each comb electrode constituting the comb electrode set including:
a plurality of electrode fingers and a plurality of dummy electrodes disposed alternately; and
a bus bar connecting the plurality of electrode fingers and the plurality of dummy electrodes in common, wherein the electrode fingers of one comb electrode are laid in a state of being inserted to the electrode fingers of the other comb electrode, a thick film thicker than each of the plurality of electrode fingers is produced in partial areas of the bus bar, and a tip gap is provided between the top of each plurality of electrode fingers and the top of the opposed dummy electrode, with a distance therebetween set not greater than $0.2\lambda$, where $\lambda$ is one period of the comb electrode.

3. A surface acoustic wave device comprising:
a pair of reflective electrodes formed on a single-crystal piezoelectric substrate: and
three sets of comb electrodes formed between the pair of reflective electrodes, each comb electrode constituting the comb electrode set including:
a plurality of electrode fingers and a plurality of dummy electrodes disposed alternately; and
a bus bar connecting the plurality of electrode fingers and the plurality of dummy electrodes in common, wherein the electrode fingers of one comb electrode are laid in a state of being inserted to the electrode fingers of the other comb electrode, a thick film thicker than each of the plurality of electrode fingers is produced in partial areas of the bus bar, and a tip gap is provided between the top of each plurality of electrode fingers and the top of the opposed dummy electrode, with a distance therebetween set not greater than $0.2\lambda$, where $\lambda$ is one period of the comb electrode.

4. A surface acoustic wave device comprising a plurality of resonators connected into a ladder shape, each resonator including:
a pair of reflective electrodes formed on a single-crystal piezoelectric substrate; and
at least one set of comb electrodes formed between the pair of reflective electrodes, each comb electrode of the comb electrode set constituting the resonator having:
a plurality of electrode fingers and a plurality of dummy electrodes disposed alternately; and
a bus bar connecting the plurality of electrode fingers and the plurality of dummy electrodes in common, wherein the electrode fingers of one comb electrode are laid in a state of being inserted to the electrode fingers of the other comb electrode, a thick film thicker than each of the plurality of electrode fingers is produced in partial areas of the bus bar, and a tip gap is provided between the top of each plurality of electrode fingers and the top of the opposed dummy electrode, with a distance therebetween set not greater than $0.2\lambda$, where $\lambda$ is one period of the comb electrode.

5. A surface acoustic wave device comprising a plurality of resonators connected into a lattice shape, each resonator including:
a pair of reflective electrodes formed on a single-crystal piezoelectric substrate; and
at least one set of comb electrodes formed between the pair of reflective electrodes, each comb electrode of the comb electrode set constituting the resonator having:
a plurality of electrode fingers and a plurality of dummy electrodes disposed alternately; and
a bus bar connecting the plurality of electrode fingers and the plurality of dummy electrodes in common, wherein the electrode fingers of one comb electrode are laid in a state of being inserted to the electrode fingers of the other comb electrode, a thick film thicker than each of the plurality of electrode fingers is produced in partial areas of the bus bar, and a tip gap is provided between the top of each plurality of electrode fingers and the top of the opposed dummy electrode, with a distance therebetween set not greater than $0.2\lambda$, where $\lambda$ is one period of the comb electrode.

6. A surface acoustic wave device comprising:
a pair of reflective electrodes formed on a single-crystal piezoelectric substrate; and
three sets of comb electrodes formed between the pair of reflective electrodes, each comb electrode forming the comb electrode set including:
a plurality of electrode fingers; and
a bus bar connecting the plurality of electrode fingers in common, wherein, the electrode fingers of one comb electrode are laid in a state of being inserted to the electrode fingers of the other comb electrode, and a thick film thicker than each plurality of electrode fingers is produced in partial areas of the bus bar, and a tip gap is provided between the top of each plurality of electrode fingers and the end face of the opposed bus bar, with a distance therebetween set not greater than $0.2\lambda$, where $\lambda$ is one period of the comb electrode.

7. A surface acoustic wave device comprising a plurality of resonators connected into a ladder shape, each resonator including:
a pair of reflective electrodes formed on a single-crystal piezoelectric substrate; and
at least one set of comb electrodes formed between the pair of reflective electrodes, each comb electrode of the comb electrode set constituting the resonator having:
a plurality of electrode fingers; and
a bus bar connecting the plurality of electrode fingers in common, wherein, the electrode fingers of one comb electrode are laid in a state of being inserted to the electrode fingers of the other comb electrode, and a thick film thicker than each plurality of electrode fingers is produced in partial areas of the bus bar, and a tip gap is provided between the top of each plurality of electrode fingers and the end face of the opposed bus bar, with a distance therebetween set not greater than $0.2\lambda$, where $\lambda$ is one period of the comb electrode.

8. A surface acoustic wave device comprising a plurality of resonators connected into a lattice shape, each resonator including:
a pair of reflective electrodes formed on a single-crystal piezoelectric substrate; and
at least one set of comb electrodes formed between the pair of reflective electrodes, each comb electrode of the comb electrode set constituting the resonator having:
a plurality of electrode fingers; and
a bus bar connecting the plurality of electrode fingers in common, wherein, the electrode fingers of one comb electrode are laid in a state of being inserted to the electrode fingers of the other comb electrode, and a thick film thicker than each plurality of electrode fingers is produced in partial areas of the bus bar, and a tip gap is provided between the top of each plurality of electrode fingers and the end face of the opposed bus bar, with a distance therebetween set not greater than $0.2\lambda$, where $\lambda$ is one period of the comb electrode.

9. The surface acoustic wave device according to claim 3 or claim 6, wherein, a ratio L/S of an electrode width L of the electrode finger to a space S between neighboring electrode fingers is set to between 0.6 and 0.8.

10. The surface acoustic wave device according to any one of claims 1 and 6–8, wherein, each partial area of the bus bar in which the thick film is produced is disposed with a distance of not greater than $0.75\lambda$ from the connection end face of the bus bar connecting to each plurality of electrode fingers where, $\lambda$ is one period of the comb electrode.

11. The surface acoustic wave device according to any one of claims 1 and 6–8, wherein, the plurality of electrode fingers and the bus bar connecting the electrode fingers is formed of metal of which principal component is aluminum, and each partial area of the bus bar in which the thick film is produced has an additional thickness of not less than $0.05\lambda$ where $\lambda$ is one period of the comb electrode.

12. The surface acoustic wave device according to claim 11, wherein each partial area of the bus bar in which the thick film is produced has an additional thickness of not greater than $0.35\lambda$ where $\lambda$ is one period of the comb electrode.

13. The surface acoustic wave device according to any one of claims 1 and 6–8, wherein each partial area of the bus bar in which the thick film is produced is formed of heavy metal.

14. The surface acoustic wave device according to any one of claims 1 and 6–8, wherein each partial area of the bus bar in which the thick film is produced is formed of insulating material.

15. The surface acoustic wave device according to any one of claims 1–8, wherein the single-crystal piezoelectric substrate is formed of $LiTaO_3$ or $LiNbO_3$, and a leaky surface acoustic wave of the substrate is used.

* * * * *